United States Patent
Ikeda et al.

(10) Patent No.: US 8,356,742 B2
(45) Date of Patent: Jan. 22, 2013

(54) METHOD FOR MANUFACTURING A SEMICONDUCTOR DEVICE USING AN AL-ZN CONNECTING MATERIAL

(75) Inventors: Osamu Ikeda, Yokohama (JP);
Masahide Okamoto, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/228,169

(22) Filed: Sep. 8, 2011

(65) Prior Publication Data

US 2012/0000965 A1    Jan. 5, 2012

Related U.S. Application Data

(62) Division of application No. 11/943,632, filed on Nov. 21, 2007, now abandoned.

(30) Foreign Application Priority Data

Nov. 21, 2006 (JP) ................................. 2006-314168

(51) Int. Cl.
*B23K 31/00* (2006.01)
*B23K 35/12* (2006.01)
(52) U.S. Cl. ..................................... 228/249; 228/179.1
(58) Field of Classification Search ........................ None
See application file for complete search history.

(56) References Cited

U.S. PATENT DOCUMENTS

| | | | |
|---|---|---|---|
| 2,987,814 A | 6/1961 | Singleton, Jr. et al. | |
| 3,079,310 A | 2/1963 | Sheridan | |
| 5,316,206 A * | 5/1994 | Syslak et al. | 228/183 |
| 5,316,863 A * | 5/1994 | Johnson et al. | 428/548 |
| 6,503,640 B2 * | 1/2003 | Wittebrood et al. | 428/654 |
| 6,563,225 B2 | 5/2003 | Soga et al. | |
| 7,000,823 B2 * | 2/2006 | Dockus et al. | 228/262.51 |
| 7,247,392 B2 * | 7/2007 | Sugano et al. | 428/654 |
| 7,451,906 B2 * | 11/2008 | Kisielius et al. | 228/56.3 |
| 2006/0027625 A1 * | 2/2006 | Dockus et al. | 228/56.3 |

FOREIGN PATENT DOCUMENTS

| | | |
|---|---|---|
| JP | 58-77784 | 5/1983 |
| JP | 62-173095 | 7/1987 |
| JP | 06-037139 | 2/1994 |

(Continued)

OTHER PUBLICATIONS

Korean Official Action issued Jun. 29, 2009, for Application No. 10-2007-118365.
Japanese Official Action issued on Mar. 10, 2009, in Application No. 2006-314168.

*Primary Examiner* — Kiley Stoner
*Assistant Examiner* — Carlos Gamino
(74) *Attorney, Agent, or Firm* — Antonelli, Terry, Stout & Kraus, LLP.

(57) ABSTRACT

In a connecting material of the present invention, a Zn series alloy layer is formed on an outermost surface of an Al series alloy layer. In particular, in the connecting material, an Al content of the Al series alloy layer is 99 to 100 wt. % or a Zn content of the Zn series alloy layer is 90 to 100 wt. %. By using this connecting material, the formation of an Al oxide film on the surface of the connecting material at the time of the connection can be suppressed, and preferable wetness that cannot be obtained with the Zn—Al alloy can be obtained. Further, a high connection reliability can be achieved when an Al series alloy layer is left after the connection, since the soft Al thereof functions as a stress buffer material.

9 Claims, 7 Drawing Sheets

FOREIGN PATENT DOCUMENTS

| | | |
|---|---|---|
| JP | 2002-261104 | 9/2002 |
| JP | 2002-307188 | 10/2002 |
| JP | 2002-358539 | 12/2002 |
| JP | 2004-332051 | 11/2004 |
| JP | 2004-358540 | 12/2004 |
| JP | 2006-307292 | 11/2006 |

* cited by examiner

FIG. 4
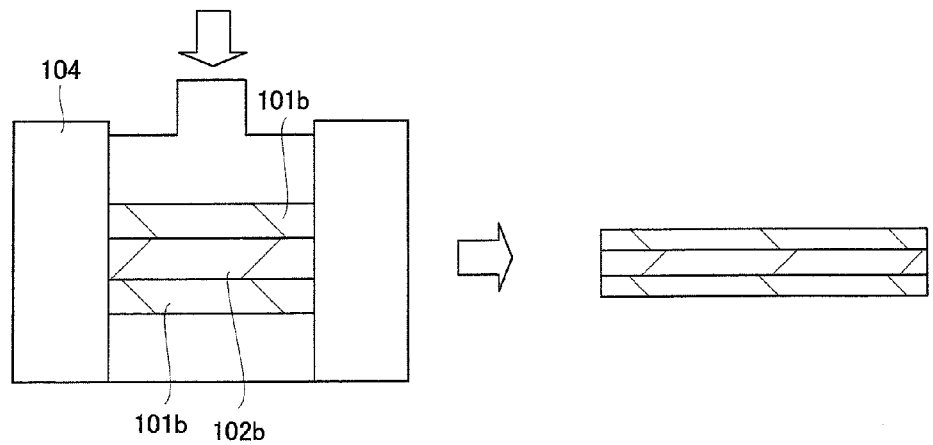
FIG. 5
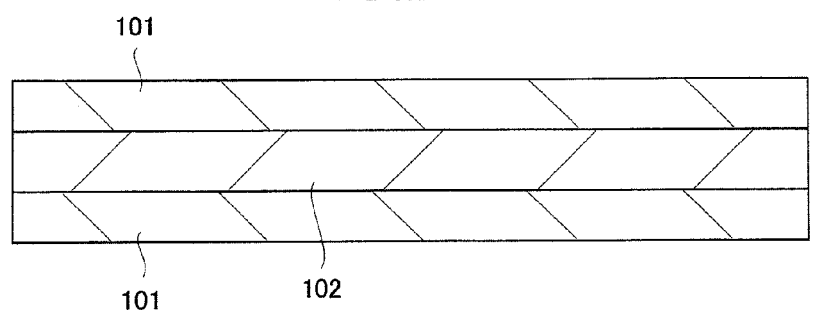
FIG. 6
| CONNECTING MATERIAL | THICKNESS (mm) | | |
|---|---|---|---|
| | Zn LAYER | Al LAYER | Zn LAYER |
| CLAD MATERIAL 1 | 10 | 50 | 10 |
| CLAD MATERIAL 2 | 20 | 50 | 20 |
| CLAD MATERIAL 3 | 20 | 100 | 20 |

FIG. 9

| EXAMPLE | CONNECTING MATERIAL | FRAME | CONNECTION TEMPERATURE | WETTABILITY | 260°C REFLOW |
|---|---|---|---|---|---|
| 1 | CLAD MATERIAL 1 | SOLID Cu | 400°C | △ | ○ |
| 2 | CLAD MATERIAL 1 | Ni | 400°C | ○ | ○ |
| 3 | CLAD MATERIAL 1 | Ni/Ag | 400°C | ○ | ○ |
| 4 | CLAD MATERIAL 1 | Ni/Au | 400°C | ○ | ○ |
| 5 | CLAD MATERIAL 2 | SOLID Cu | 400°C | △ | ○ |
| 6 | CLAD MATERIAL 2 | Ni | 400°C | ○ | ○ |
| 7 | CLAD MATERIAL 2 | Ni/Ag | 400°C | ○ | ○ |
| 8 | CLAD MATERIAL 2 | Ni/Au | 400°C | ○ | ○ |
| 9 | CLAD MATERIAL 3 | SOLID Cu | 400°C | △ | ○ |
| 10 | CLAD MATERIAL 3 | Ni | 400°C | ○ | ○ |
| 11 | CLAD MATERIAL 3 | Ni/Ag | 400°C | ○ | ○ |
| 12 | CLAD MATERIAL 3 | Ni/Au | 400°C | ○ | ○ |
| COMPARISON EXAMPLE | CONNECTING MATERIAL | FRAME | CONNECTION TEMPERATURE | WETTABILITY | 260°C REFLOW |
| 1 | Zn-6Al(wt.%) | SOLID Cu | 400°C | × | − |
| 2 | Zn-6Al(wt.%) | Ni | 400°C | × | − |
| 3 | Zn-6Al(wt.%) | Ni/Ag | 400°C | × | − |
| 4 | Zn-6Al(wt.%) | Ni/Au | 400°C | × | − |
| 5 | Zn | SOLID Cu | 450°C | △ | × |
| 6 | Zn | Ni | 450°C | ○ | × |
| 7 | Zn | Ni/Ag | 450°C | ○ | × |
| 8 | Zn | Ni/Au | 450°C | ○ | × |

FIG. 12

| EXAMPLE | CONNECTING MATERIAL | FRAME | CONNECTION TEMPERATURE | WETTABILITY |
|---|---|---|---|---|
| 13 | CLAD MATERIAL 1 | SOLID Cu | 400°C | △ |
| 14 | CLAD MATERIAL 1 | Ni | 400°C | ○ |
| 15 | CLAD MATERIAL 1 | Ni/Ag | 400°C | ○ |
| 16 | CLAD MATERIAL 1 | Ni/Au | 400°C | ○ |
| 17 | CLAD MATERIAL 2 | SOLID Cu | 400°C | △ |
| 18 | CLAD MATERIAL 2 | Ni | 400°C | ○ |
| 19 | CLAD MATERIAL 2 | Ni/Ag | 400°C | ○ |
| 20 | CLAD MATERIAL 2 | Ni/Au | 400°C | ○ |
| 21 | CLAD MATERIAL 3 | SOLID Cu | 400°C | △ |
| 22 | CLAD MATERIAL 3 | Ni | 400°C | ○ |
| 23 | CLAD MATERIAL 3 | Ni/Ag | 400°C | ○ |
| 24 | CLAD MATERIAL 3 | Ni/Au | 400°C | ○ |
| COMPARISON EXAMPLE | CONNECTING MATERIAL | FRAME | CONNECTION TEMPERATURE | WETTABILITY |
| 9 | Zn-6Al(wt.%) | SOLID Cu | 400°C | × |
| 10 | Zn-6Al(wt.%) | Ni | 400°C | × |
| 11 | Zn-6Al(wt.%) | Ni/Ag | 400°C | × |
| 12 | Zn-6Al(wt.%) | Ni/Au | 400°C | × |

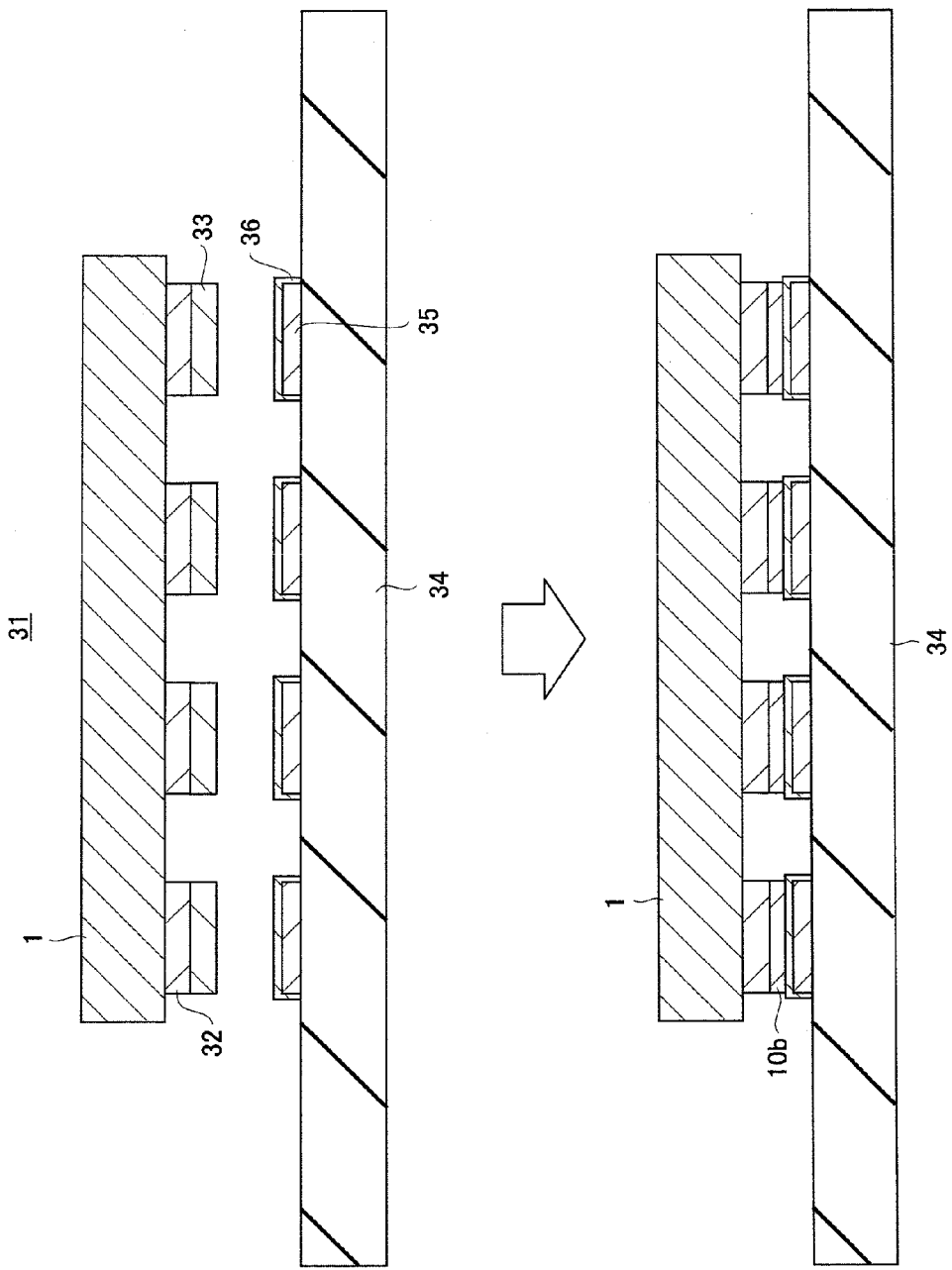

METHOD FOR MANUFACTURING A SEMICONDUCTOR DEVICE USING AN AL-ZN CONNECTING MATERIAL

CROSS-REFERENCE TO RELATED APPLICATION

The present application claims priority from Japanese Patent Application No. JP 2006-314168 filed on Nov. 21, 2006, the content of which is hereby incorporated by reference into this application.

This application is a Divisional application of application Ser. No. 11/943,632, filed Nov. 21, 2007, now abandoned the contents of which are incorporated herein by reference in their entirety.

TECHNICAL FIELD OF THE INVENTION

The present invention relates to a technology for a connecting material. More particularly, the present invention relates to a technology effectively applied to a structure and a manufacturing method of the connecting material, and a semiconductor device, a power semiconductor device and a power module using the connecting material.

BACKGROUND OF THE INVENTION

As a technology that the inventors of the present invention have examined, a semiconductor device using a connecting material will be described with reference to FIG. 1 and FIG. 2. FIG. 1 is a diagram showing a structure of a conventional semiconductor device. FIG. 2 is a diagram for explaining the flash caused by remelted solder.

As shown in FIG. 1, a semiconductor device 7 is manufactured by connecting a semiconductor element 1 onto a frame 2 by solder 3, wire-bonding an inner lead of a lead 5 and an electrode of the semiconductor element 1 by a wire 4, and then sealing these components by sealing resin 6 or inert gas.

The semiconductor device 7 is reflow soldered using Sn—Ag—Cu series medium-temperature lead-free solder to a printed circuit board. The melting point of the Sn—Ag—Cu series lead-free solder is as high as about 220° C., and it is supposed that a connecting portion is heated up to 260° C. at the reflow connection. Therefore, for the temperature hierarchy, high-lead solder having a melting point of 290° C. or higher is used in the die bonding of a semiconductor element in a semiconductor device. The high-lead solder contains lead of 85 wt. % or more as its constituent, and the environmental load of the high-lead solder is larger than that of Sn-Pb eutectic solder that has been prohibited by the RoHS directive that took effect in July, 2006. Therefore, the development of a substitute connecting material to replace the high-lead solder has been desired.

At present, the melting point of the Sn—Ag—Cu series solder that has been already developed is 260° C. or lower. Therefore, if the solder is used in the die bonding of a semiconductor element, it is melted in the secondary mounting (maximum temperature: 260° C.). In the case where a surrounding area of the connecting portion is molded with resin, when the inner solder is melted, due to the volume expansion in the melting, the so-called flash occurs in some cases as shown in FIG. 2, in which the solder 3 leaks from the interface between the sealing resin 6 and the frame 2. Alternatively, if not leaks, the action of leakage occurs, and as a result, a large void 8 is formed in the solder after its solidification, so that a defective product is produced. As candidates of the substitute material, Au series solders such as Au—Sn, Au—Si and Au—Ge, Zn and Zn—Al series solders, and Bi, Bi—Cu, and Bi—Ag solders have been reported, and further examination has been made all over the world.

However, the Au series solder contains Au of 80 wt. % or more as its constituent, and thus it lacks versatility in terms of cost. The Bi series solder has a heat conductivity of about 9 W/mK which is lower than that of the current high-lead solder, and it is supposed that the application thereof to a power semiconductor device, a power module and others requiring high heat dissipation characteristics is difficult. Further, although Zn and Zn—Al series solders have a high heat conductivity of about 100 W/mK, the solder wettability thereof is low (in particular, Zn—Al series solder) and the solder itself is hard, and there occurs a problem that a semiconductor element is frequently broken due to the thermal stress at the time of cooling after the connection.

In Japanese Patent Application Laid-Open Publication No. 2002-358539 (Patent Document 1) and Japanese Patent Application Laid-Open Publication No. 2004-358540 (Patent Document 2), by using an alloy consisting of Al of 1 to 7 wt. %, Mg of 0.5 to 6 wt. %, Ga of 0.1 to 20 wt. %, P of 0.001 to 0.5 wt. % and the balance of Zn, an alloy consisting of Ge of 2 to 9 wt. %, Al of 2 to 9 wt. %, P of 0.001 to 0.5 wt. % and the balance of Zn, or an alloy consisting of Ge of 2 to 9 wt. %, Al of 2 to 9 wt. %, Mg of 0.01 to 0.5 wt. %, P of 0.001 to 0.5 wt. % and the balance of Zn, the wettability of the Zn series solder alloy to Cu and Ni is improved and the melting point thereof is decreased. However, since Al and Mg are contained, an Al oxide film and an Mg oxide film are formed on a surface of the melting portion by the heating in the connection. Since these films decrease the wetness, there is the possibility that the sufficient wetness cannot be obtained unless the film is mechanically broken by scrubbing or the like. Further, since no improvement is achieved in the hardness of the solder, the improvement for the breakage of a semiconductor element due to the thermal stress at the time of cooling after the connection or in the temperature cycle cannot be expected.

In Japanese Patent Application Laid-Open Publication No. 2002-261104 (Patent Document 3), an In, Ag or Au layer is provided for an outermost surface of a Zn—Al series alloy, thereby suppressing the oxidation of the surface of the Zn—Al series alloy and improving the wettability. However, since processes such as plating and evaporation onto the Zn—Al surface are indispensable for providing the In, Ag or Au layer, the processes for manufacturing the material are increased. Similarly, though the hardness can be reduced by adding In, the effect enough to prevent the breakage of the semiconductor element due to the thermal stress at the time of cooling after the connection cannot be expected.

SUMMARY OF THE INVENTION

The inventors of the present invention have thought that a Zn—Al series alloy can be replaced with high-lead solder. In the above-described conventional technologies, sufficient considerations are not given to the following points. That is, since Al is contained in a Zn—Al series alloy, sufficient wetness cannot be ensured. Since the surface treatment is carried out for the Zn—Al series alloy, the processes for manufacturing the material are increased. Further, the breakage of a semiconductor element due to the thermal stress at the time of cooling after the connection or in the temperature cycle cannot be suppressed.

In consideration of these points, an object of the present invention is to provide a connecting material capable of applying a Zn—Al series alloy having a melting point of 260° C. or higher to the connection, improving the wetness at the time of connection, reducing the processes for manufacturing the material and improving the connection reliability for the thermal stress.

The above and other objects and novel characteristics of the present invention will be apparent from the description of this specification and the accompanying drawings.

The typical ones of the inventions disclosed in this application will be briefly described as follows.

The present invention provides a connecting material having a Zn series alloy layer formed on the outermost surface of an Al series alloy layer. In particular, the connecting material in which an Al content of the Al series alloy layer is 99 to 100 wt. % and the connecting material in which a Zn content of the Zn series alloy layer is 90 to 100 wt. % are provided.

Further, the present invention provides a manufacturing method of a connecting material in which a connecting material having an Al series alloy layer formed on a Zn series alloy layer and another Zn series alloy layer formed thereon is manufactured by a clad rolling or a pressure forming.

Further, the present invention provides a semiconductor device in which a semiconductor element is connected to a frame by the connecting material (die-bonding structure), a semiconductor device in which a metal cap is connected to a substrate by the connecting material (hermetic sealing structure) and a semiconductor device in which a semiconductor element is connected by the connection material used as bumps (flip-chip mounting structure).

These and other objects, features and advantages of the invention will be apparent from the following more particular description of preferred embodiments of the invention, as illustrated in the accompanying drawings.

BRIEF DESCRIPTIONS OF THE DRAWINGS

FIG. 4 is a diagram for describing the pressure forming in the embodiment of the present invention;

FIG. 5 is a diagram showing a cross section of the connecting material according to the embodiment of the present invention;

FIG. 6 is a diagram showing the configuration of the connecting material in FIG. 5;

FIG. 9 is a diagram showing the evaluation results of the wettability and the reflow test in the semiconductor device in FIG. 7 together with the results in the comparison examples;

FIG. 12 is a diagram showing the evaluation results of the wettability in the semiconductor device in FIG. 10 together with the results in the comparison examples; and FIG. 13 is a diagram showing a cross section and a mounting structure of still another semiconductor device using the connecting material in FIG. 6 in the embodiment of the present invention.

DESCRIPTIONS OF THE PREFERRED EMBODIMENTS

Figure 1:
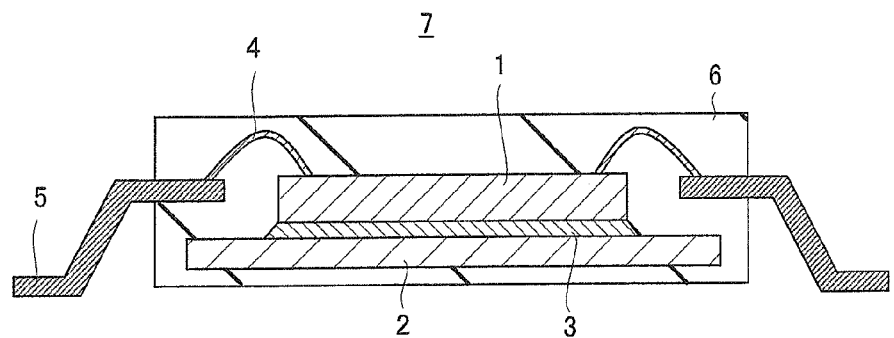
FIG. 1 is a diagram showing a structure of a conventional semiconductor device.
Figure 2:
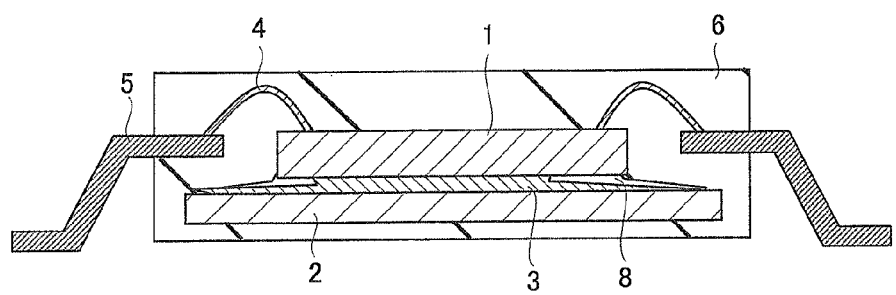
FIG. 2 is a diagram for describing the flash caused by remelted solder in the semiconductor device in FIG. 1.

Hereinafter, embodiments of the present invention will be described in detail with reference to the accompanying drawings. Note that components having the same function are denoted by the same reference symbols throughout the drawings for describing the embodiment, and the repetitive description thereof will be omitted.

(Outline of the Embodiments of the Present Invention)

The first invention is to provide a connecting material having a Zn series alloy layer formed on the outermost surface of an Al series alloy layer. In the case of a Zn—Al alloy, since Al is contained, an Al oxide film is formed on the surface at the moment of melting. Therefore, unless the film is mechanically broken, the sufficient wetness cannot be obtained. On the other hand, in the present invention, the surface of the connecting material is the Zn series alloy containing only a little amount of Al regarded as an impurity. Therefore, sufficient wetness can be ensured before the Zn series alloy and the Al series alloy are reacted to from an Al oxide film in the connection. Also, since the melting portion turns to a Zn—Al series alloy in the connection, the melting point thereof decreases to about 380° C. Accordingly, since it is lower than the melting point of Zn, that is, 420° C., the thermal stress generated at the time of cooling after the connection can be reduced compared with that of pure Zn, and the breakage of a semiconductor element can be suppressed. By leaving an Al alloy layer at the time of connection, the soft Al functions as a stress buffer material, and thus, the connection reliability can be improved. Even if the temperature is not increased to 420° C. which is the melting point of Zn in the connection, since the diffusion proceeds between the Zn layer and the Al layer in contact with each other if the temperature is 380° C. or higher, the Zn—Al eutectic crystal having the melting point of 380° C. is formed, and hence, the connection is achieved.

The second invention is to provide a connecting material in which an Al content of the Al series alloy layer is 99 to 100 wt. %. The closer to 100% the purity of Al becomes, the softer the material becomes, and the stress buffering function can be achieved easily. Meanwhile, when the Al purity is less than 99 wt. %, it is difficult to obtain the stress buffering function since the 0.2% offset yield strength becomes an undesirable value and the hardness is increased. The 0.2% offset yield strength is preferably 30 N/mm$^2$ or less. The thickness of the Al layer is preferably 30 to 200 μm. When the thickness thereof is 30 μm or less, chip cracks occur in some cases since the thermal stress cannot be sufficiently buffered. When the thickness thereof is 200 μm or more, since Al, Mg, Ag and Zn have a thermal expansion rate higher than that of a Cu frame, the effect of the thermal expansion is increased and the problem of the decrease in reliability due to the occurrence of the chip crack or the like may occur.

The third invention is to provide a connecting material in which a Zn content of the Zn series alloy layer is 90 to 100 wt. % (other than principal constituent, an Al content is less than 0.01 wt. %). When Al of 0.01 wt. % or more is contained in the Zn series alloy, there is the possibility that the preferable wetness cannot be obtained due to the increase of the amount of an Al oxide film on the surface of the connecting material at the time of connection. The thickness of the Zn series alloy layer is preferably 5 to 100 μm. When the thickness thereof is less than 5 μm, it is difficult to ensure the wetness in the entire connecting portion.

Figure 3:
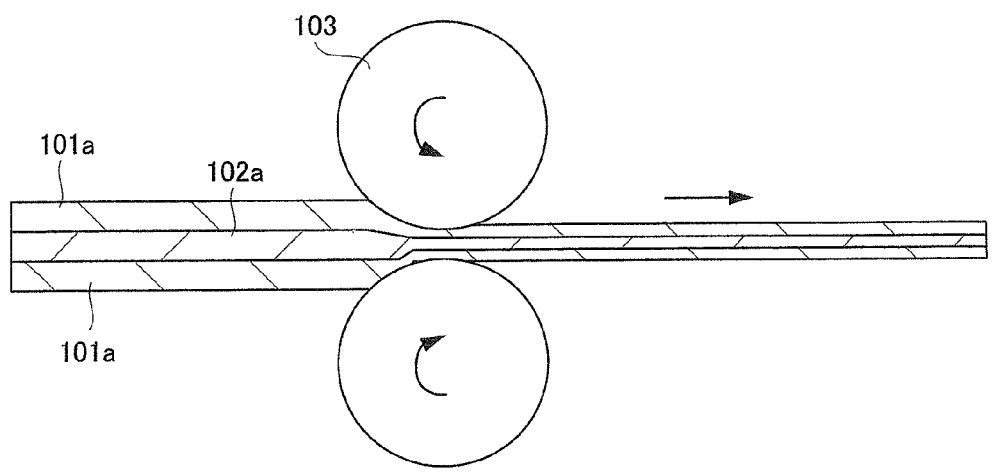
FIG. 3 is a diagram for describing the clad rolling in an embodiment of the present invention.

The fourth invention is to provide a manufacturing method for manufacturing a connecting material having an Al series alloy layer formed on a Zn series alloy layer and another Zn series alloy layer formed thereon by the clad rolling. As shown in FIG. 3, when the clad rolling is performed using a roller 103, Zn series alloy layers 101a and an Al series alloy layer 102a are brought into contact with each other and are largely deformed by pressure. Therefore, the oxide film formed on the surfaces of the Zn series alloy layers 101a and the Al series alloy layer 102a is broken, and the metal junction is made by the new surfaces. In the clad rolling, the thermal load at a temperature in which the diffusion of Zn and Al becomes significant is not applied. Therefore, Al does not diffuse in the Zn layer disposed on the surface and does not reach the outermost layer, and the good wetness can be obtained at the time of connection.

The fifth invention is to provide a manufacturing method for manufacturing a connecting material having an Al series alloy layer formed on a Zn series alloy layer and another Zn series alloy layer formed thereon by the pressure forming. As shown in FIG. 4, when the pressure forming is performed using a pressure forming machine 104, Zn series alloy layers 101b and an Al series alloy layer 102b are brought into contact with each other and are largely deformed by pressure. Therefore, the oxide film formed on the surfaces of the Zn series alloy layers 101b and the Al series alloy layer 102b is broken, and the metal junction is made by the new surfaces. In the pressure forming, if the thermal load is reduced to a temperature level in which the diffusion of Zn and Al is not significant, Al does not diffuse in the Zn layer disposed on the surface and does not reach the outermost layer, and the good wetness can be obtained at the time of connection.

Hereinafter, embodiments and examples based on the above-described first to fifth inventions will be specifically described. Herein, the descriptions will be made based on the connecting material used in the die bonding of a semiconductor device, power semiconductor device and a power module and manufactured by the clad rolling.

(Embodiment)

FIG. 5 shows a cross section of a connecting material according to the embodiment of the present invention. In the connecting material according to the present embodiment, a Zn series alloy layer (simply referred to as Zn layer or Zn) 101 as a lower layer, an Al series alloy layer (simply referred to as Al layer or Al) 102 as an intermediate layer and a Zn series alloy layer (simply referred to as Zn layer or Zn) 101 as an upper layer are formed. As shown in FIG. 3 described above, this connecting material is manufactured by stacking the Zn series alloy layer 101a, the Al series alloy layer 102a and the Zn series alloy layer 101a and then performing the rolling process, that is, the clad rolling.

FIG. 6 shows all the connecting materials (referred to as clad material) thus manufactured. In the clad material 1, the thicknesses of the Zn layer, the Al layer and the Zn layer are 10, 50 and 10 μm, respectively. In the clad material 2, the thicknesses thereof are 20, 50 and 20 μm, and in the clad material 3, the thicknesses thereof are 20, 100 and 20 μm, respectively.

EXAMPLES 1 to 12

Figure 7:
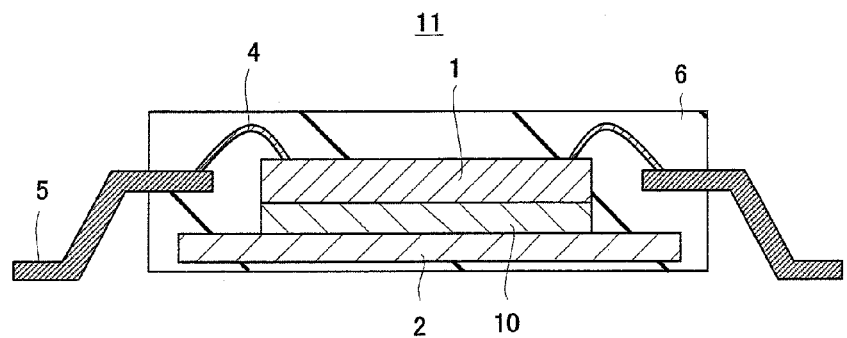
FIG. 7 is a diagram showing a cross section of a semiconductor device using the connecting material in FIG. 6 (examples 1 to 12) in the embodiment of the present invention.

In the examples 1 to 12, as shown in FIG. 7, the connecting material 10 is used for the die bonding of the semiconductor device 11. This semiconductor device 11 includes a semiconductor element 1, a frame 2 connecting the semiconductor element 1, a lead 5 whose one end functions as an external terminal, a wire 4 connecting the other end of the lead 5 and an electrode of the semiconductor element 1, and a sealing resin 6 which seals the semiconductor element 1 and the wire 4, and the semiconductor element 1 and the frame 2 are connected by the connecting material 10.

Figure 8:
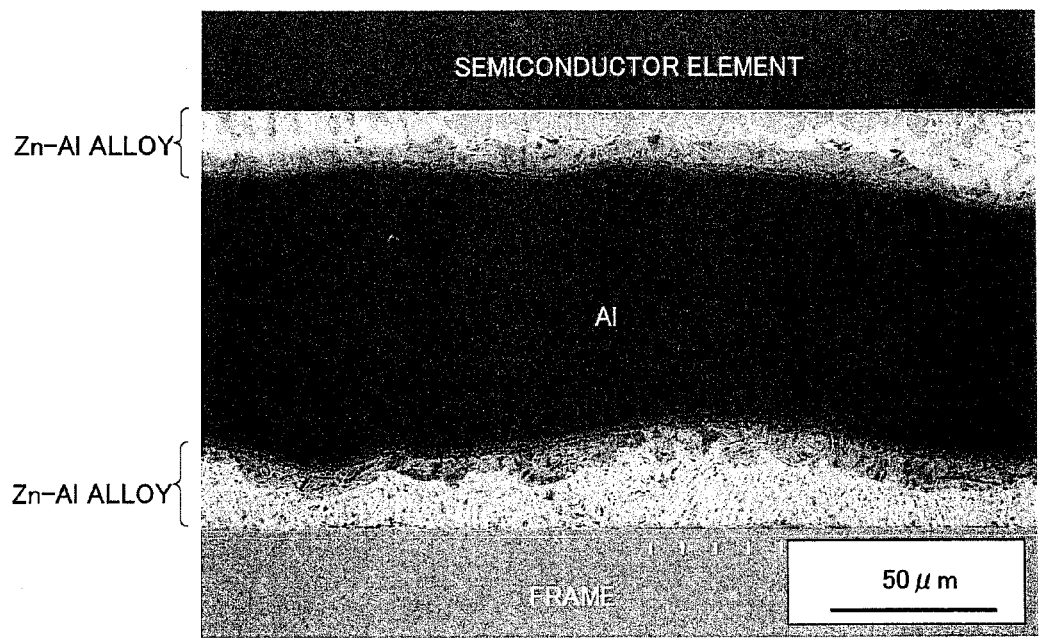
FIG. 8 is a diagram showing a picture of a cross section of a connecting portion in the connecting material in the semiconductor device in FIG. 7.

In the manufacture of the semiconductor device 11, the connecting material 10 is supplied onto the frame 2 made of solid Cu or the frame 2 on which the Ni, Ni/Ag or Ni/Au plating is performed and the semiconductor element 1 is placed thereon, and thereafter, the heating is performed at 400° C. for 1 min. in an $N_2$ atmosphere while applying pressure, whereby the semiconductor element 1 is die-bonded. FIG. 8 shows the cross section of the connecting portion at that time. A Zn—Al alloy layer formed by the reaction between Zn and Al at the time of connection is formed between the frame 2 and an Al layer of the connecting material 10. The same is true between the semiconductor element 1 and the Al layer of the connecting material 10. Thereafter, the semiconductor element 1 and the lead 5 are wire-bonded by the wire 4, and are sealed with the sealing resin 6 at 180° C.

FIG. 9 shows the evaluation results of the wettability at the time of the die bonding and the connection durability after performing the reflow test with the maximum temperature of 260° C. or higher for the semiconductor device three times, with respect to the examples 1 to 12 (using clad materials 1, 2 and 3 in FIG. 6). The wettability is evaluated as O when 90% or more of the wetness to an area of a semiconductor element is obtained, evaluated as Δ when less than 90% to 75% or more of the wetness is obtained, and evaluated as x when the wetness is less than 75%. With regard to the reflow test at 260° C. (maximum temperature), the examples where the connection area after the reflow test is decreased by 5% or more in comparison to the connection area before the reflow test are evaluated as x and the examples where it is decreased by less than 5% are evaluated as O.

According to the evaluation results, when the clad materials 1 to 3 (Zn/Al/Zn) are used for the connection, the wetness of 90% or more can be obtained for the frames having the Ni, Ni/Ag, or Ni/Au plating. However, for the frames made of solid Cu, the wetness is about 80% and is evaluated as Δ. With regard to the reflow test at 260° C., there is no change in the connection area in all of the examples 1 to 12.

Meanwhile, in the comparison examples 1 to 4 where the conventional connecting material (Zn-6Al (wt. %)) is used, a hard Al oxide film is formed on the surface of the melt Zn—Al alloy. Therefore, the wetness is less than 75% for all the frames. In particular, in the cases of the solid Cu frame and the Ni plating frame, almost no wetness can be obtained. In the comparison examples 5 to 8 using the conventional connecting material (Zn), 90% or more of the wetness can be obtained when the connection is performed at the temperature of the melting point of Zn, that is, 420° C. or higher. However, the thermal stress generated due to the difference in thermal expansion rate between the semiconductor element and the Cu frame at the time of cooling after the connection cannot be alleviated, and the semiconductor element is broken in some examples. When semiconductor devices are manufactured using the semiconductor elements saved from the breakage and the reflow test is performed thereto, the breakage of the semiconductor elements is observed.

As described above, according to the examples 1 to 12, when the semiconductor material 10 of the present embodiment is used for the die bonding of the semiconductor device 11, since a Zn series alloy layer containing 0.01 wt. % or less of Al is formed on the outermost surface of an Al series alloy layer, the formation of an Al oxide film on the surface of the connecting material at the time of connection is suppressed, and the preferable wetness that cannot be obtained with the Zn—Al alloy can be obtained. Further, when an Al series alloy layer is left after the connection, since the soft Al functions as a stress buffer material, the high connection reliability can be achieved.

EXAMPLES 13 to 24

Figure 10:
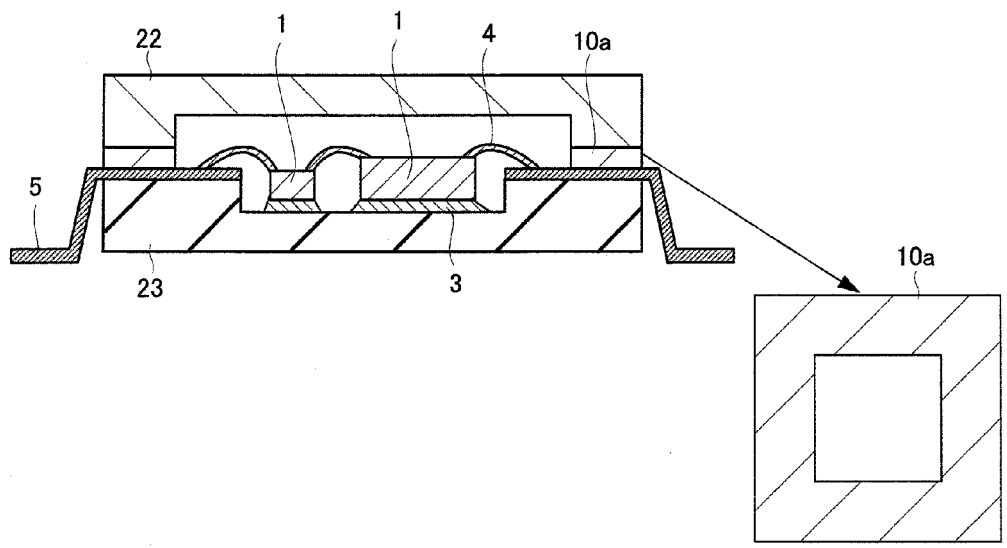
FIG. 10 is a diagram showing a cross section of another semiconductor device using the connecting material in FIG. 6 (examples 13 to 24) in the embodiment of the present invention.

In the examples 13 to 24, as shown in FIG. 10, the connecting material 10a of the present invention is used as the sealing material of a semiconductor device 21 requiring the hermetic sealing. This semiconductor device 21 includes a semiconductor element 1, a module substrate 23 connecting the semiconductor element 1, a lead 5 whose one end functions as an external terminal, a wire 4 connecting the other end of the lead 5 and an electrode of the semiconductor element 1, and a metal cap 22 which hermetically seals the semiconductor element 1 and the wire 4 and is connected to the module substrate 23, and the module substrate 23 and the metal cap 22 are connected by the connecting material 10a. Note that, in the semiconductor device 21, chip components and others are also connected onto the module substrate 23.

In the manufacture of the semiconductor device 21, after the semiconductor element 1, the chip components and others are connected to the module substrate 23 by an Sn series lead-free solder 3, conductive adhesive, a Cu powder/Sn powder compound material or the like, the connecting material 10a is placed between the module substrate 23 and the metal cap 22, and the module substrate 23 and the metal cap 22 are connected while applying pressure at 400° C.

Figure 11:
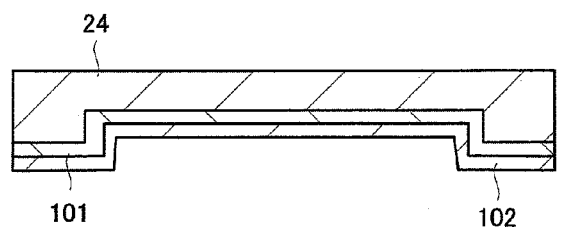
FIG. 11 is a diagram showing a metal cap integrated with a connecting material in the semiconductor device in FIG. 7.

Note that, with regard to the metal cap, a metal cap 22a integrated with a connecting material composed of a metal alloy 24 such as kovar or invar, an Al series alloy layer 102 and a Zn series alloy layer 101 processed together by the clad rolling as shown in FIG. 11 can be used for achieving the hermetic sealing.

FIG. 12 shows the evaluation results of the wettability at the time of die bonding with respect to the examples 13 to 24 (using the clad materials 1, 2 and 3 in FIG. 6). The wettability is evaluated as O when the wetness capable of maintaining the hermeticity to the sealing area can be obtained, and evaluated as x when the hermeticity cannot be maintained due to a void, crack and others.

According to the evaluation results, when connecting materials such as the clad materials 1, 2 and 3 (Zn/Al/Zn) are used for the connection, the wetness capable of sufficiently maintaining the hermeticity can be obtained for the frames having the Ni, Ni/Ag or Ni/Au plating. However, for the solid Cu frame, the evaluation is x due to the insufficient wetness and the formation of voids.

Meanwhile, in the comparison examples 9 to 12 where the conventional connecting material (Zn-6Al (wt. %)) is used, a hard Al oxide film is formed on the surface of the melt Zn—Al alloy. Therefore, the hermeticity cannot be maintained due to the insufficient wetness and the formation of voids.

As described above, according to the examples 13 to 24, when the connecting material 10a of the present embodiment is used as the sealing material of the semiconductor device 21, the formation of an Al oxide film on the surface of the connecting material at the time of the connection can be suppressed, and the wetness capable of sufficiently maintaining the hermeticity can be obtained.

In the semiconductor device 21 shown in FIG. 10, the connecting material 10 of the present invention can be used instead of the lead-free solder 3 for the connection between the semiconductor element 1 and the module substrate 23. In this case, the effects similar to those of the above-described examples 1 to 12 can be achieved.

OTHER EXAMPLE

In other example, the connecting material 10b of the present invention is used as a bump in the semiconductor device 31 requiring the flip-chip mounting as shown in FIG. 13. The semiconductor device 31 includes a semiconductor element 1, and the semiconductor element 1 and a substrate 34 on which the semiconductor element 1 is to be mounted are connected by the connecting material 10b.

In the manufacture of the semiconductor device 31, the connecting material 10b is placed between a pad obtained by performing an Ni or Ni/Au plating 36 onto a Cu wiring 35 of the substrate 34 and an electrode obtained by performing a Zn plating 33 onto an Al wiring 32 of the semiconductor element 1, and the substrate 34 and the semiconductor element 1 are connected while applying pressure at 380° C.

Also in this example, when the connecting material 10b of the present embodiment is used as the bump of the semiconductor device 31, the formation of an Al oxide film on the surface of the connecting material at the time of the connection can be suppressed, and the preferable wetness can be obtained.

In the foregoing, the invention made by the inventors of the present invention has been concretely described based on the embodiments. However, it is needless to say that the present invention is not limited to the foregoing embodiments and various modifications and alterations can be made within the scope of the present invention.

More specifically, in the description above, although the application of the present invention has been described with using the die boding of a semiconductor device as an example, the present invention can be applied to various types of semiconductor devices as long as the semiconductor device is die-bonded. Such semiconductor devices include, for example, an alternator diode, an IGBT module, a front-end module such as an RF module, a power module for a vehicle, and others.

Further, in the foregoing description, the case where a semiconductor device is reflow-mounted onto a module substrate has been described. However, the present invention can be applied to the case where the semiconductor device is used for the MCM (Multi Chip Module) structure.

As described above, the connecting material of the present invention can be effectively used for the die bonding, the sealing material for the hermetic sealing, and the flip-chip bonding of a semiconductor device, a power semiconductor device, a power module and others.

The effects obtained by typical aspects of the present invention will be briefly described below.

According to the present invention, since the connecting material having a Zn series alloy layer formed on the outermost surface of an Al series alloy layer is used, the formation of an Al oxide film on the surface of the connecting material at the time of connection can be suppressed, and the preferable wetness can be obtained. Also, since the Al series alloy layer functions as a stress buffer material after the connection, the high connection reliability can be achieved. As a result, it becomes possible to apply a Zn—Al series alloy having a melting point of 260° C. or higher to the connection, improve the wetness at the time of connection, reduce the processes for manufacturing the material and improve the connection reliability for the thermal stress.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of manufacturing a semiconductor device in which a first member and a second member are connected by a connecting material, the method comprising:
    a preparation step of settling a material for forming the connecting material between the first member and the second member; and
    a connection step of connecting the first member and the second member by heat treatment after the preparation step, to form the connecting material,
    wherein, in the connection step, an Al-based layer, a first Zn-based layer and a second Zn-based layer of the material for forming the connecting material are fused to form a first Zn—Al-based layer and a second Zn—Al-based layer, and after the connection step, a part of the Al-based layer is not fused and left as an Al-based layer,
    wherein the connecting material, after the connection step, has an Al-based layer and first and second Zn—Al-based layers respectively provided on opposed surfaces of the Al-based layer, and
    wherein the first member is a semiconductor element.

2. The method of manufacturing a semiconductor device according to claim 1,
    wherein the material for forming the connecting material, before the connection step, has the Al-based layer, and the first and second Zn-based layers respectively provided on opposed surfaces of the Al-based layer.

3. The method of manufacturing a semiconductor device according to claim 1,
    wherein after the connection step, an Al content of the Al-based layer is 99 to 100 wt. %.

4. The method of manufacturing a semiconductor device according to claim 3,
    wherein after the connection step, the Al-based layer has a 0.2% offset yield strength of 30 N/mm$^2$ or less.

5. The method of manufacturing a semiconductor device according to claim 1,
    wherein a Zn content of the Zn-based layer is 90 to 100 wt. %.

6. The method of manufacturing a semiconductor device according to claim 5,
    wherein an Al content of the Zn-based layer is 0.01 wt. % or less.

7. The method of manufacturing a semiconductor device according to claim 1,
    wherein the material for forming the connecting material is formed by a clad rolling or pressure forming performed to the first and second Zn-based layers on opposed surfaces of the Al-based layer.

8. The method of manufacturing a semiconductor device according to claim 1,
    wherein the connecting material has a first surface and a second surface opposite to the first surface, and
    the first surface of the connecting material is connected to the first member and a region on an opposite surface of a region connected to the first member is connected to the second member.

9. The method of manufacturing a semiconductor device according to claim 1,
    wherein the second member is any one of a substrate, a frame, a metal cap and a lead.

* * * * *